United States Patent
Comeau

(10) Patent No.: US 8,750,210 B2
(45) Date of Patent: Jun. 10, 2014

(54) WIRELESS LONG TERM EVOLUTION RADIO ARCHITECTURE SYSTEM AND METHOD

(75) Inventor: Adrien Joseph Comeau, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 156 days.

(21) Appl. No.: 13/194,508

(22) Filed: Jul. 29, 2011

(65) Prior Publication Data

US 2013/0028178 A1    Jan. 31, 2013

(51) Int. Cl.
*H04W 4/00* (2009.01)

(52) U.S. Cl.
USPC .......................................................... 370/328

(58) Field of Classification Search
USPC .......... 370/310, 311, 318, 328–339; 375/297; 455/13.4, 522, 127.1–127.3
See application file for complete search history.

(56) References Cited

U.S. PATENT DOCUMENTS

| | | | |
|---|---|---|---|
| 5,568,088 A * | 10/1996 | Dent et al. | 330/151 |
| 5,955,920 A * | 9/1999 | Reudink et al. | 330/124 R |
| 5,966,048 A * | 10/1999 | Thompson | 330/124 R |
| 6,006,111 A * | 12/1999 | Rowland | 455/561 |
| 6,243,038 B1 * | 6/2001 | Butler et al. | 342/373 |
| 6,381,212 B1 * | 4/2002 | Larkin | 370/210 |
| 7,206,355 B2 | 4/2007 | McGowan et al. | |
| 7,248,656 B2 | 7/2007 | da Silveira | |
| 7,508,885 B2 | 3/2009 | McGowan et al. | |
| 2004/0014500 A1 | 1/2004 | Chun | |
| 2006/0040624 A1 * | 2/2006 | Lipka | 455/114.3 |
| 2008/0238544 A1 | 10/2008 | Morris et al. | |
| 2010/0020900 A1 * | 1/2010 | Cai et al. | 375/297 |
| 2010/0098191 A1 | 4/2010 | Morris et al. | |
| 2012/0328050 A1 * | 12/2012 | Bai et al. | 375/297 |

FOREIGN PATENT DOCUMENTS

| | | |
|---|---|---|
| EP | 2178204 A1 | 4/2010 |
| WO | 2006060114 A1 | 6/2006 |
| WO | 2007134615 A1 | 11/2007 |

OTHER PUBLICATIONS

Chun, Adaptive power pooling for multi-antenna base station system, IEEE, 3 pages, 2003.*
International Search Report and Written Opinion dated Oct. 29, 2012 for International Application Serial No. PCT/IB2012/052925, International Filing Date: Jun. 8, 2012 consisting of 12-pages.

* cited by examiner

*Primary Examiner* — Frank Duong
(74) *Attorney, Agent, or Firm* — Christopher & Weisberg, P.A.

(57) ABSTRACT

A method for providing a radio architecture for a long term evolution (LTE) communication system is disclosed. According to one aspect, a radio provides power pooling and direct up-conversion of signals to be transmitted. Power pooling is provided by adjusting the gain and phase of each of a plurality of carrier signals in a digital matrix based on feedback signals received from an analog matrix, such that the output signals are coupled to one or more selected radio output ports. Direct up-conversion is achieved by up-sampling and filtering the carrier signals to be transmitted.

24 Claims, 4 Drawing Sheets

WIRELESS LONG TERM EVOLUTION RADIO ARCHITECTURE SYSTEM AND METHOD

TECHNICAL FIELD

The present invention relates to wireless communications, and in particular to a long term evolution (LTE) radio system and method.

BACKGROUND

Cellular radio base stations in wireless communication networks are characterized by having more than 100 product properties. As many as 20 of these properties define the radio portion of these base stations. These product properties drive different radio variants, some of which can be addressed by designing the radio to comply with multiple standards and or making the radio programmable. Making the radios programmable or to comply with multiple standards vastly decreases the number of radio variants needed for a base station.

However, several irreducible factors limit the reduction in the number of radio variants needed. These include a number of transmit and receive antennas per sector, which can typically be 1, 2, 4 or 8 transmit antennas, and as many receive antennas. Another factor, is the required transmit power, which, for a base station covering a wide area could be 60 watts to 100 watts or greater. For a medium range base station the required power may be on the order of 6 watts, and for a local area base station may be less than 250 milli-watts. Yet another factor that affects the number of required radio variants is the set of bands of the evolved universal terrestrial radio access (EUTRA) network standard. Also, another factor is whether the radio is used indoors or outdoors. In consideration of these factors, there are about 960 radios needed to cover the complete market space.

With about 960 radios required to cover the complete market space, manufacturers and cellular radio operators are faced with a daunting problem. The manufacturer has the problem of efficiently manufacturing a large number of radio variants and the operator has a problem of radio variant inventory, maintenance and handling. One way to reduce the number of radios required to cover the market space is by increasing the instantaneous bandwidth of each radio to reduce the number of radios needed to cover the EUTRA bands. For example, an instantaneous bandwidth of 400 Mega Hertz (MHz) enables an operator to span all EUTRA bands with only 4 radios. In this case the total number of radios required to span the market space is about 380, still a very large number.

Therefore, there is a need for a radio system architecture that reduces a number of radios required to span the market space in a wireless communication system.

SUMMARY

The present invention advantageously provides a method and system for an improved radio architecture in an LTE wireless communication system. According to one aspect, the invention provides a radio for wireless communication that uses power pooling and direct up-conversion to reduce a number of radios required to span a market space. The radio includes radio output ports driven by a plurality of power amplifiers. The radio includes power pooling circuitry. The power pooling circuitry adjusts gains and phases of a plurality of carrier signals based on first feedback signals, and selectively directs output signals from the power amplifiers to a selected one or more radio outputs. The first feedback signals are based on the selectively directed output signals. A plurality of direct up-converters are each in communication directly or indirectly with a corresponding one of the plurality of power amplifiers. Each direct up-converter up-samples the gain and phase adjusted carrier signals. The plurality of power amplifiers amplify the up-sampled adjusted carrier signals and output the amplified the adjusted up-sampled carrier signals for transmission using the selected at least one radio output port.

According to another aspect, the invention provides a method of processing multiple signals in a transmitter of a wireless communication base station, where the transmitter has a plurality of power amplifiers and a plurality of radio output ports. The method includes receiving at a digital matrix a plurality of data-bearing carrier signals. The gain and phase of the carrier signals are adjusted in the digital matrix based on first feedback signals such that the outputs of the power amplifiers are channeled to a selected one or more of the plurality of radio output ports. The gain and phase adjusted carrier signals are up-converted by a direct up-conversion module. The up-converted adjusted carrier signals are amplified in power amplifiers. The amplified up-converted adjusted carrier signals are applied to an analog matrix which channels the signals to the selected one or more radio output ports. Outputs of the analog matrix are also used to provide feedback signals at the digital matrix to enable the digital matrix to adjust the phase and gain of the carrier signals as needed to cause the signals to be channeled to the selected one or more radio output ports.

According to yet another aspect, the invention provides a radio in a wireless communication system. The radio includes a plurality of radio output ports, a transmitter, a plurality of antennas and a receiver. The transmitter includes a digital matrix to adjust the gain and phase of data-bearing carrier signals to be transmitted by the radio. The adjustments to the gain and phase of the carrier signals are based on feedback signals such that the data-bearing carrier signals are channeled to a selected at least one radio output port. The transmitter also includes a plurality of direct up-converters that receive and up-convert the adjusted carrier signals. The transmitter also includes a plurality of power amplifiers that amplify the adjusted up-converted carrier signal. An analog matrix distributes the amplified signals to the selected one or more radio output ports. A plurality of couplers in the transmitter couple feedback signals from the analog matrix to the digital matrix. The receiver receives signals from the antennas during reception and may, optionally, perform direct down-conversion of the received signals.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
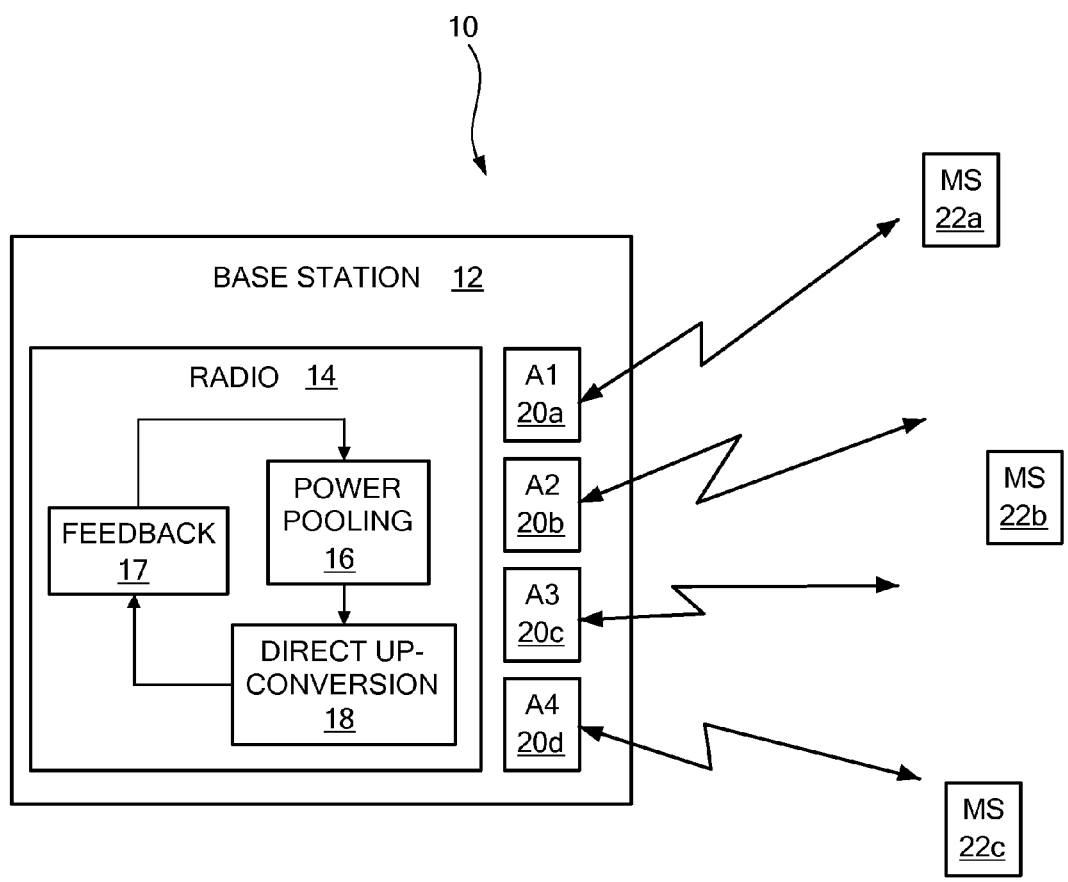
FIG. 1 is a diagram of a wireless communication system constructed in accordance with principles of the present invention.

Before describing in detail exemplary embodiments that are in accordance with the present invention, it is noted that the embodiments reside primarily in combinations of apparatus components and processing steps related to implementing a system and method for providing an efficient architecture for a long term evolution (LTE) radio. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Referring now to the drawing figures, in which like reference designators denote like elements, there is shown in FIG. 1 a diagram of a wireless communication system constructed in accordance with principles of the present invention and denoted generally as "10." The wireless communication system 10 includes a base station 12 having a radio 14 that employs power pooling circuitry 16, feedback circuit 17, and direct up converters 18 in the transmitter, as explained below. In some embodiments, the radio 14 may also employ direct down conversion in the receiver.

Power pooling is an arrangement by which the power available from a set of power amplifiers having low power can be controlled to coherently add at one or more output ports. The power per port is 1/N where N is the number of output ports to be used. Thus, for example, by pooling the outputs of four 25 watt (W) power amplifiers, one may deliver 100 W at one port, 50 W at two ports, 33 W at three ports and 25 W at four ports are all available from one single radio hardware unit 14. Power pooling alone results in a reduction of a number of required radios to about 240. Power pooling 16 receives a feedback signal via feedback circuit 17 based on the outputs of an analog matrix, as is described below. The feedback signal from feedback circuit 17 is used to determine gain and phase adjustments applied to carrier signals to enable the power to be directed to desired ports.

Direct up-conversion is a technology that enables the EUTRA bands to be covered by as few as 3 or 4 radios. Direct up-conversion involves up-sampling a signal by a factor of N to create an image spectrum at a transmit frequency which is selected by a filter. Direct down-conversion involves filtering and down sampling by a factor of N. Direct up/down sampling technology reduces the number of radio variants by a factor of 10/4, i.e., from about 960 to about 380. In some embodiments, the direct up-conversion and direct down conversion are programmable.

Combining power pooling and direct up and down-conversion achieves a reduction in a number of required radios to span the market space by a factor of 10, resulting in the number of required radios being reduced to approximately 96.

The base station 12 includes output ports 20a, 20b, 20c, and 20d, referred to collectively as output ports 20. Note that the output ports 20 are shown separately from the radio 14 for convenience and ease of explanation, but that the output ports may be considered part of the radio 14. The base station 12 is in wireless communication with a plurality of mobile subscriber units 22a, 22b, 22c, referred to collectively herein as mobile units 22. More or less output ports 20 and more or less mobile units 22 may be included in a wireless communication device than are shown in FIG. 1. Also, a base station will typically include a plurality of radios, even though only one radio is shown in FIG. 1.

An exemplary wireless transceiver (radio) 14 constructed in accordance with principles of the present invention is described with reference to FIG. 2. Data is received at the radio from a data source at a distribution network device 24, and data is transmitted from the radio to a location external to the radio via the distribution network device 24. The distribution network device 24 provides an interface from the radio to the radio controlling equipment. More particularly, the distribution network device 24 distributes multiple single channel samples to the digital transmit processors 26 and from the digital receivers 28.

Figure 2:
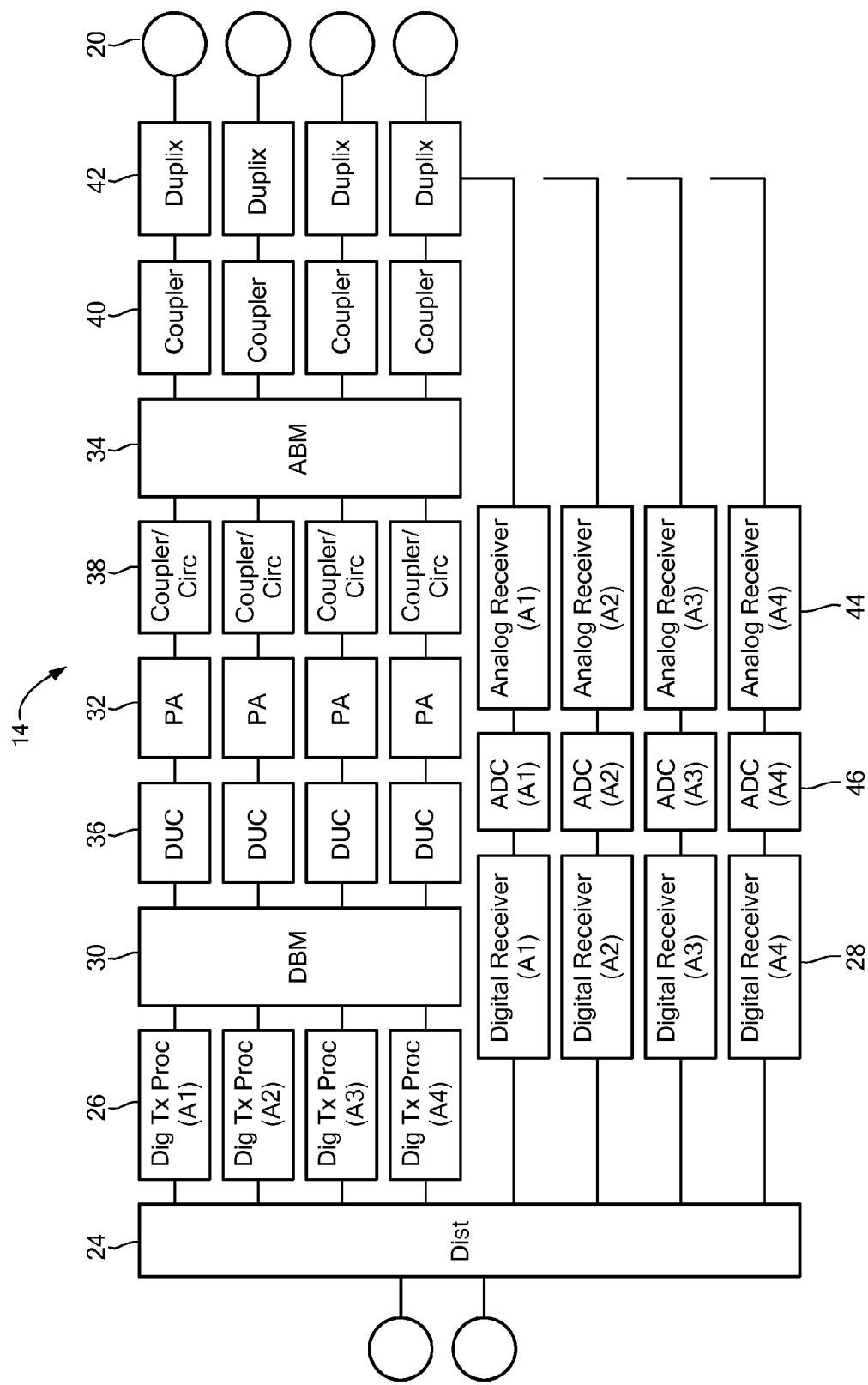
FIG. 2 is a block diagram of a wireless transceiver constructed in accordance with principles of the present invention.

FIG. 2 also shows a plurality of digital transmit processors 26 for processing each of a plurality of channels. Each digital transmit processor 26 performs baseband processing of the single carriers including, automatic level control (ALC), filtering (pulse shaping) equalization, gain/phase shifting and power measurements. A digital transmit processor 26 changes the sample rate of a single carrier signal to a rate that allows frequency shifting and summation into a multi-carrier signal. More particularly, the digital transmit processor 26 shifts the single carrier in preparation of summation into a multi-carrier signal. The digital transmit processor 26 adds the input up-sampled frequency-shifted carriers to create one multi-carrier signal per path. Power control can also be performed by the digital transmit processor 26.

FIG. 2 also shows a digital Butler matrix (DBM) 30 that distributes the multi-carrier signals from the digital transmit processors 26 to the power amplifier chains with appropriate phase and gain adjustments so that the outputs of a plurality of power amplifiers 32 are channeled to a selected one or more radio output ports 20. The phase and gain adjustments are based on feedback signals from an analog Butler matrix (ABM) 34. For example, the phase and gain adjustments may be adjusted to cause constructive interference at one output port 20 and to cause destructive interference at another output port 20. Note that the matrix 30 is shown as a digital Butler matrix, but other matrix architectures may be employed.

The outputs of the DBM 30 are fed to a direct up-converter (DUC) 36. The direct up-converter 36 processes the signals from the outputs of the DBM 30 to drive a digital analog converter (not shown in FIG. 2) to provide a desired radio frequency (RF) analog signal. Direct up-conversion is implemented by up-sampling by a factor of N and filtering about a carrier frequency of the desired RF signal. Linearizers (not shown in FIG. 2) receive feedback signals from the power amplifiers 32 to linearize the outputs of the power amplifiers 32.

The power amplifiers 32 provide power amplification. The total power available to the output ports 20 is the total power of all available power amplifiers 32. For example, if each power amplifier is capable of providing 25 W of output power, a total of 100 W is available for distribution to one or more of the output ports 20.

A coupler/circulator 38 for each power amplifier chain has a first output and a second output. The first output couples a sample of the output powers of each power amplifier 32 to provide feedback for power amplifier linearization. The second output of each coupler 38 couples the output of each power amplifier to an analog Butler matrix (ABM) 34.

The ABM 34 combines the RF signals from the couplers 38 and distributes these signals to a particular set of output ports. Note that although an analog Butler matrix is shown in FIG. 2, other matrix architectures may be employed. The output ports to which the RF signals are distributed are selected based on the phase and gain adjustments of the DBM 30. A portion of the outputs of the ABM 34 are coupled by the couplers 40 back to the DBM 30 to provide feedback to determine in the DBM 30 the gain and phase adjustments necessary to channel the output power into the desired ports 20. The desired ports may be selected based on a desired output power for each port.

Duplexers 42 couple the power from couplers 40 to the output ports 20 during transmission, and couple the power received from the output ports 20 to the analog receivers 44 during reception. The analog receivers 44 amplify and demodulate received signals and couple the amplified and demodulated signals to the analog to digital converters 46. The analog to digital converters 46 convert the amplified, demodulated analog signals to digital signals.

The digital signals are coupled to the digital receivers 28. The digital receivers 28 receive the multi-carrier digital signals and frequency-shift them to baseband. The digital receivers 28 perform filtering, equalization, gain and phase shifting, and power control functions. Note that in some embodiments, the receiver components 44, 46 and 28 may be replaced by direct digital down-conversion components which filter the received signals and down-sample them to baseband.

Figure 3:
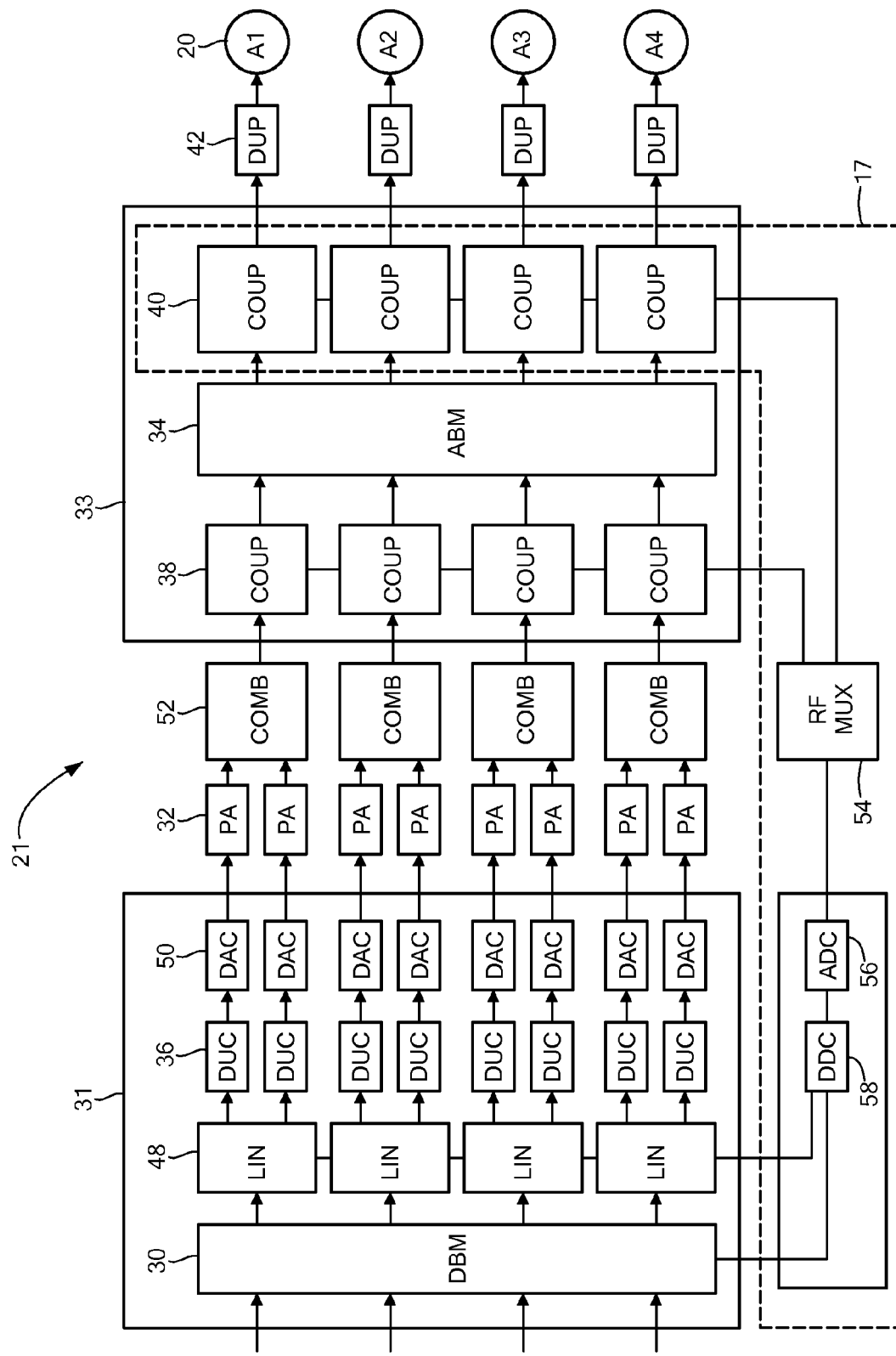
FIG. 3 is a more detailed block diagram of a transmitter constructed in accordance with principles of the present invention.

FIG. 3 is a more detailed block diagram of a transmitter 21 constructed in accordance with principles of the present invention. The transmitter 21 includes a digital processing transmit section 31, a plurality of power amplifiers 32, an analog processing transmit section 33, and radio output ports 20. The digital processing transmit section 31 includes a digital matrix 30, linearizers 48, direct up-converters 36, and digital to analog converters 50. The analog processing transmit section 33 includes couplers 38, an analog matrix 34 and couplers 40.

The digital matrix 30 distributes a plurality of carrier signals to the plurality of power amplifier channels after adjusting a gain and phase of each carrier signal based on feedback signals from couplers 40 such that the outputs of the plurality of power amplifiers are channeled by the analog matrix 34 to a selected one or more radio output ports 20.

The linearizers 48 pre-amplify the gain/phase adjusted carrier signals to compensate for non-linearity of the power amplifiers based on feedback signals from the couplers 38. The feedback signals from the couplers 38 are samples of the signal from the power amplifiers 32. The direct up-converters 36 up-convert the carrier signals by over-sampling the carrier signals and filtering the over-sampled carrier signals about a desired carrier frequency. The digital to analog converters 50 convert the digital carriers to analog RF signals. The digital analog converters 50 may operate at a sample rate that is based on a highest frequency of a carrier signal. The digital to analog converters 50 may thus have fixed sample rates selected to up-convert the adjusted carrier signals to a plurality of separate frequency bands. The analog RF signals are fed to the power amplifiers 32 which amplify the RF signals before they are combined by the combiners 52.

In the configuration of FIG. 3 there are two power amplifier chains per channel. For example the power amplifiers may be Doherty amplifiers, having one amplifier for amplifying peak power signals and having another amplifier for amplifying signals at less than peak power. In some embodiments, only a single power amplifier chain is provided for each channel.

The outputs of the combiners 52 are coupled to the couplers 38. A sample of the power from each combiner 52 is coupled to an RF multiplexer 54 and fed back to the linearizers 48 via an analog to digital converter 56 and a direct down converter 58. Most of the power from combiners 52 are coupled by couplers 38 to the analog matrix 34, which channels the amplified up-sampled adjusted carrier signals to a selected one or more radio output ports 20.

Samples of the outputs of the analog matrix 34 are coupled by couplers 40 to the RF multiplexer 54 to the digital matrix 30. The portion of the outputs of the analog matrix coupled by the couplers 40 are used as feedback signals that control gain and phase adjustments of the carrier signals received by the digital matrix 30. The feedback circuit 17 includes the couplers 40, the RF multiplexer 54, the ADC 56 and the DDC 58. The remainder of the power from the analog matrix 34 is coupled by couplers 40 to the duplexers 42, which in turn, couple the power to the output ports 20. The output ports 20 are coupled to antennas (not shown) which are oriented to transmit to one or more geographical sectors serviced by the radio.

Note that in one embodiment, a single RF multiplexer 54 may be provided for the feedback signals from the couplers 38 and the couplers 40. In alternative embodiments, one multiplexer is provided for the feedback from the couplers 38 and another multiplexer is provided for the feedback from the couplers 40.

Thus, one embodiment is a radio for wireless communication that uses power pooling and direct up-conversion to reduce the number of radios required support all potential frequencies and modulation arrangements within a market space. The radio includes one or more radio output ports 20 fed by a plurality of power amplifiers 32. The radio includes a digital processing transmit section 31 and an analog processing transmit section 33.

The digital processing transmit section 31 includes a digital matrix 30 that distributes a plurality of carrier signals to the plurality of power amplifiers 32. The digital matrix 30 adjusts a gain and phase of each carrier signal based on first feedback signals such that the outputs of the plurality of power amplifiers 32 are channeled to a selected one or more radio output ports 20. The digital processing section 31 also includes a plurality of direct up-converters 36 that are each in communication directly or indirectly with a corresponding one of the plurality of power amplifiers 32. Each direct up-converter up-samples the gain and phase adjusted carrier signals from the digital matrix 30. The plurality of power amplifiers 32 amplify the up-sampled adjusted carrier signals.

The analog processing transmit section 33 includes an analog matrix 34, such as an analog Butler matrix, which channels the amplified up-sampled adjusted carrier signals to the selected one or more radio output ports 20. A plurality of couplers 40 couple first feedback signals from the analog matrix 34 to the digital matrix 30 to enable the digital matrix to adjust the gain and phase of each carrier signals, such that the outputs of the plurality of power amplifiers 32 are channeled to the selected one or more radio output ports 20.

Figure 4:
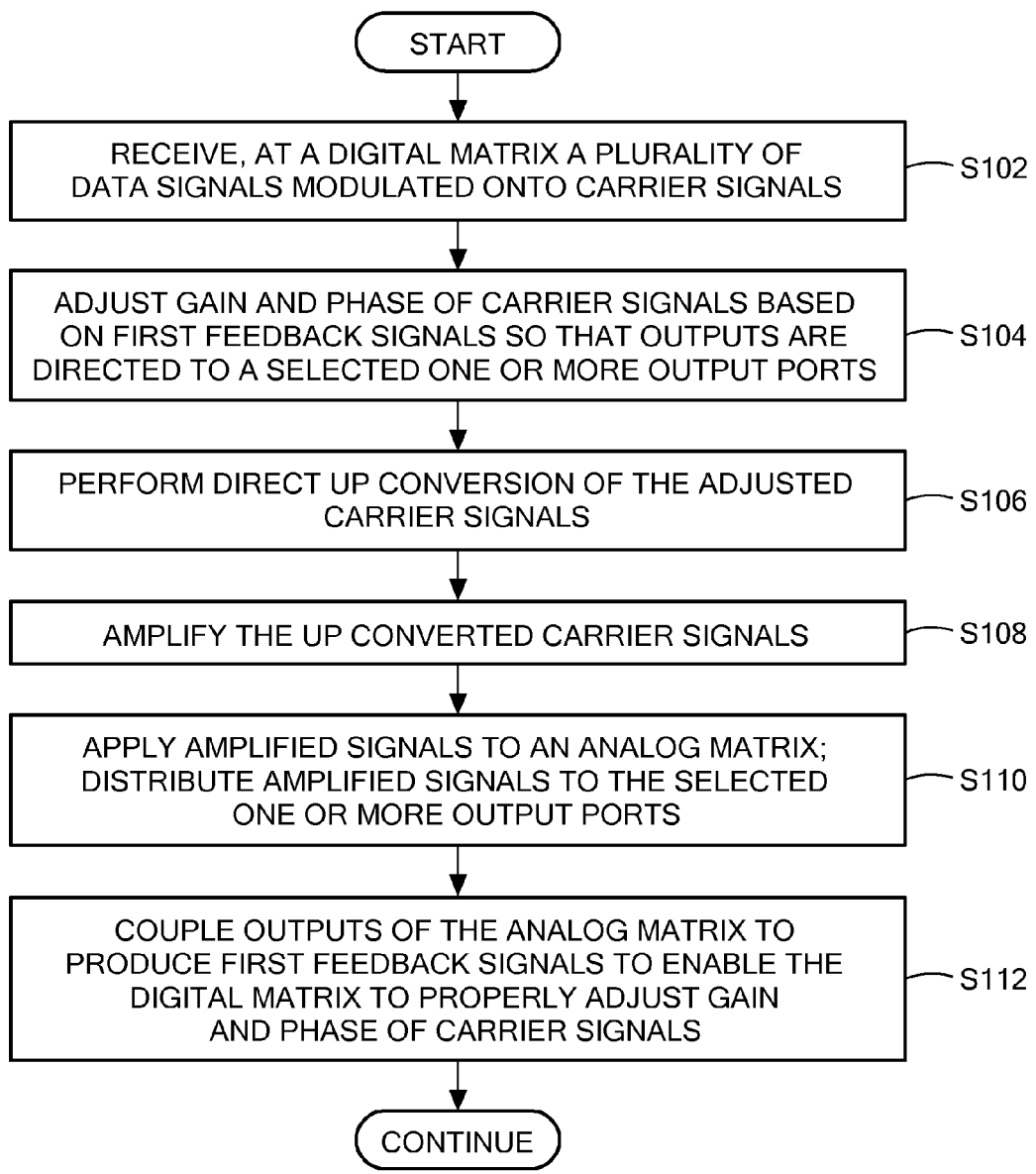
FIG. 4 is a flow chart of an exemplary method of processing signals in a transmitter constructed according to principles of the present invention.

An exemplary method of processing signals in a transmitter is described with reference to FIG. 4. A plurality of data signals modulated onto carrier signals are received at a digital matrix (step S102). Within the digital matrix, the gain and phase of each carrier signal is adjusted based on feedback signals so that the outputs of power amplifiers are directed to one or more radio output ports (step S104). Direct up-conversion of the adjusted carrier signals is performed (step S106).

The up-converted carrier signals are amplified by a plurality of power amplifiers (step S108). The amplified signals are applied to an analog matrix which distributes the amplified signals to the selected one or more radio output ports (step S110). Outputs of the analog matrix are coupled as feed back signals to enable the digital matrix to adjust gain and phase of the carrier signals to cause distribution of the amplified signals to the selected one or more radio output ports (step S112).

Thus, one embodiment is a method of processing multiple signals in a transmitter of a wireless communication base station, where the transmitter has a plurality of power amplifiers and a plurality of radio output ports. The method includes receiving at a digital matrix a plurality of data-bearing carrier signals. The gain and phase of the carrier signals are adjusted in the digital matrix based on first feedback signals such that the outputs of the power amplifiers are channeled to a selected one or more of the plurality of radio output ports.

The gain and phase adjusted carrier signals are up-converted by a direct up-conversion module. The up-converted adjusted carrier signals are amplified in power amplifiers. The amplified up-converted adjusted carrier signals are applied to an analog matrix, which channels the signals to the selected one or more radio output ports. Outputs of the analog matrix are also used to provide feedback signals at the digital matrix to enable the digital matrix to adjust the phase and gain of the carrier signals as needed to cause the signals to be channeled to the selected one or more radio output ports.

The present invention can be realized in hardware, or a combination of hardware and software. Any kind of computing system, or other apparatus adapted for carrying out the methods described herein, is suited to perform the functions described herein. A typical combination of hardware and software could be a specialized computer system, e.g., a router, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

In addition, unless mention was made above to the contrary, it should be noted that all of the accompanying drawings are not to scale. It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A radio for wireless communication, the radio comprising:
    a plurality of radio output ports;
    a plurality of power amplifiers;
    power pooling circuitry, the power pooling circuitry:
        adjusting, by a digital matrix, gains and phases of a plurality of carrier signals based on first feedback signals such that outputs of the plurality of power amplifiers add coherently only at N selected ones of the plurality of radio output ports, N being an integer less than all of the plurality of radio output ports, and destructively interfere at remaining radio output ports; and
        selectively directing-output signals from the power amplifiers to N selected ones of the plurality of radio output ports, 1/N of a total output of all the power amplifiers being allocated to each of the N selected radio output ports, N being less than a total number of the plurality of radio output ports, the first feedback signals being based on the output signals; and
    a plurality of digital direct up-converters, each of the plurality of digital direct up-converters in communication with a corresponding power amplifier, each of the plurality of digital direct up-converters processing the adjusted carrier signals, the processing including up-sampling the adjusted carrier signals; and
    the plurality of power amplifiers amplifying the adjusted up-sampled carrier signals and outputting the amplified adjusted up-sampled carrier signals for transmission using the selected N radio output ports.

2. The radio of claim 1, wherein the digital matrix of the power pooling circuitry is configured to distribute the plurality of carrier signals to the plurality of power amplifiers via the direct up-converters.

3. The radio of claim 1, wherein the power pooling circuitry comprises: an analog matrix, the analog matrix having a plurality of inputs receiving the amplified up-sampled adjusted carrier signals from a corresponding power amplifier and having a plurality of outputs channeling the amplified up-sampled adjusted carrier signals to the radio output ports.

4. The radio of claim 1, further comprising first couplers arranged to couple the first feedback signals from the directed output signals to the digital matrix of the power pooling circuitry.

5. The radio of claim 4, further comprising an RF multiplexer, the RF multiplexer multiplexing the first feedback signals from the plurality of first couplers.

6. The radio of claim 1, wherein the power pooling circuitry comprises a plurality of linearity devices, each linearity device:
    electrically coupled to at least one direct up-converter; and
    providing linearity correction to a power amplifier corresponding to the direct up-converter.

7. The radio of claim 6, wherein each of the plurality of power amplifiers has a power amplifier output and the linearity devices receive second feedback signals from a corresponding power amplifier output.

8. The radio of claim 7, further comprising a plurality of second couplers, the plurality of second couplers coupled to the power amplifiers and providing the second feedback signals.

9. The radio of claim 5, wherein the multiplexed first feedback signals are converted to digital signals before coupling the first feedback signals to the power pooling circuitry.

10. The radio of claim 1, further comprising a plurality of digital-to-analog converters DACs, each DAC coupled to a corresponding power amplifier, the plurality of DACs operating at a sample rate that is based on a highest frequency of a carrier signal.

11. The radio of claim 1, wherein the N selected radio output ports are selected based on a desired power per radio output port.

12. The radio of claim 1, further comprising a plurality of antennas, each antenna coupled to a corresponding radio output port.

13. The radio of claim 11, wherein each antenna is directed to a different geographical sector serviced by the radio.

14. A method for processing multiple signals in a transmitter of a wireless communication base station, the transmitter having a plurality of power amplifiers and a plurality of radio output ports, the method comprising:
   receiving at a digital matrix a plurality of data-bearing carrier signals;
   selecting N radio output ports, N being less than a total number of the plurality of radio output ports;
   adjusting gain and phase of the carrier signals in the digital matrix and distributing the adjusted carrier signals to the plurality of power amplifiers, the adjusting based on first feedback signals such that outputs of the power amplifiers add coherently at the N selected radio output ports and destructively interfere at remaining radio output ports, 1/N of a total output power of all the power amplifiers being allocated to each of the N selected radio output ports;
   performing digital direct up-conversion of the adjusted carrier signals;
   amplifying the up-converted adjusted carrier signals in the power amplifiers;
   applying the amplified up-converted adjusted carrier signals to an analog matrix, the analog matrix channeling the applied signals to the radio output ports; and
   coupling outputs of the analog matrix to produce the first feedback signals at the digital matrix to enable the digital matrix to adjust the phase and gain of the carrier signals.

15. The method of claim 14, further comprising applying linearity corrections to the adjusted carrier signals to compensate for non-linearity of the power amplifiers.

16. The method of claim 14, wherein the linearity corrections are based on second feedback signals coupled from the power amplifiers.

17. The method of claim 16, wherein the second feedback signals are multiplexed and digitized.

18. The method of claim 14, wherein the first feedback signals are multiplexed and digitized.

19. The method of claim 14, further comprising converting the up-converted signals to analog form prior to input to the power amplifiers.

20. A radio in a wireless communication system, the radio comprising:
   a plurality of radio output ports;
   a transmitter, the transmitter including:
      a digital matrix, the digital matrix adjusting gain and phase of data-bearing carrier signals to be transmitted by the radio, the adjusting based on first feedback signals such that the data-bearing carrier signals to add coherently at N selected radio output ports, N being less than a total number of the plurality of radio output ports, and destructively interfere at remaining radio output ports;
      a plurality of digital direct up-converters, the digital direct up-converters receiving the adjusted carrier signals and producing up-converted carrier signals;
      a plurality of power amplifiers, the power amplifiers amplifying the up-converted carrier signals, the outputs of the plurality of power amplifiers being channeled to the N selected radio output ports such that 1/N of a total output power of the plurality of output ports is allocated to each of the N selected radio output ports;
      an analog matrix, the analog matrix distributing the amplified signals to the radio output ports;
      a plurality of couplers, the couplers coupling first feedback signals from the analog matrix to the digital matrix; and
   a plurality of antennas, each antenna coupled to a radio output port; and
   a receiver, the receiver receiving signals from the antennas during reception.

21. The radio of claim 20, wherein the receiver comprises a direct down-conversion unit, the direct down-conversion unit down-converting the received signals via direct sampling of the received signals.

22. The radio of claim 20, wherein a selected one of the output ports receives power from a plurality of the power amplifiers.

23. The radio of claim 22, wherein the power from the plurality of power amplifiers is combined by the analog matrix.

24. The radio of claim 20, wherein the direct up-converters include digital to analog converters having fixed sample rates selected to up-convert the adjusted carrier signals to a plurality of separate frequency bands.

* * * * *